US010641540B2

(12) United States Patent
Williamson

(10) Patent No.: US 10,641,540 B2
(45) Date of Patent: May 5, 2020

(54) ANTI-CONDENSING CONTROL PANEL WITH INTERGRAL OVERCURRENT PROTECTION DEVICES

(71) Applicant: Hill Phoenix, Inc., Conyers, GA (US)

(72) Inventor: Donald E. Williamson, Conyers, GA (US)

(73) Assignee: Hill Phoenix, Inc., Conyers, GA (US)

( * ) Notice: Subject to any disclaimer, the term of this patent is extended or adjusted under 35 U.S.C. 154(b) by 92 days.

(21) Appl. No.: 16/146,480

(22) Filed: Sep. 28, 2018

(65) Prior Publication Data

US 2019/0120537 A1 Apr. 25, 2019

Related U.S. Application Data

(60) Provisional application No. 62/574,618, filed on Oct. 19, 2017.

(51) Int. Cl.

| F25D 21/04 | (2006.01) |
|---|---|
| H02H 3/08 | (2006.01) |
| H05K 7/20 | (2006.01) |
| H05B 1/02 | (2006.01) |
| H05K 5/00 | (2006.01) |
| F25D 29/00 | (2006.01) |
| F25D 23/02 | (2006.01) |
| F25D 21/08 | (2006.01) |

(52) U.S. Cl.
CPC ............. *F25D 21/04* (2013.01); *H02H 3/08* (2013.01); *H05B 1/0288* (2013.01); *H05K 5/0017* (2013.01); *H05K 7/20954* (2013.01); *F25D 21/08* (2013.01); *F25D 23/02* (2013.01); *F25D 29/005* (2013.01); *H05B 2203/035* (2013.01)

(58) Field of Classification Search
CPC .......... F25D 21/04; F25D 21/08; F25D 23/02; F25D 29/005; H02H 3/08; H05B 2203/035; H05K 5/0017; H05K 7/20954; A47F 3/04
See application file for complete search history.

(56) References Cited

U.S. PATENT DOCUMENTS

2009/0056353 A1* 3/2009 Sunderland ........... F25D 29/008
 62/214
2017/0347473 A1* 11/2017 Freer .................... H05K 5/0213

* cited by examiner

*Primary Examiner* — Marc E Norman
(74) *Attorney, Agent, or Firm* — Foley & Lardner LLP

(57) ABSTRACT

An anti-condensing system includes a control panel configured to electrically couple between a power source and a temperature regulating display unit. The control panel includes a housing defining an interior cavity, a door selectively repositionable to facilitate accessing the interior cavity of the housing, and a circuitry assembly disposed within the interior cavity. The circuitry assembly includes a relay configured to couple to a heating element of the temperature regulating display unit, an overcurrent protection breaker coupled to the relay and directly integrated into the control panel such that the overcurrent protection device can be locked out at the control panel, and a control circuit coupled to the relay. The control circuit is configured to actively control the relay to prevent condensation from forming on the temperature regulating display unit.

20 Claims, 3 Drawing Sheets

ANTI-CONDENSING CONTROL PANEL WITH INTERGRAL OVERCURRENT PROTECTION DEVICES

CROSS-REFERENCE TO RELATED PATENT APPLICATIONS

This application claims the benefit of U.S. Provisional Application No. 62/574,618, filed Oct. 19, 2017, which is incorporated herein by reference in its entirety.

BACKGROUND

Temperature regulating display units are frequently used to keep food products maintained at a required temperature, as well as allow consumers to see into the temperature regulating display units to choose from the food products stored therein. Often, the temperature of components of the temperature regulating display units (e.g., frame, glass doors, etc.) fall beneath the dew point and condensation forms thereon.

SUMMARY

Figure 1:
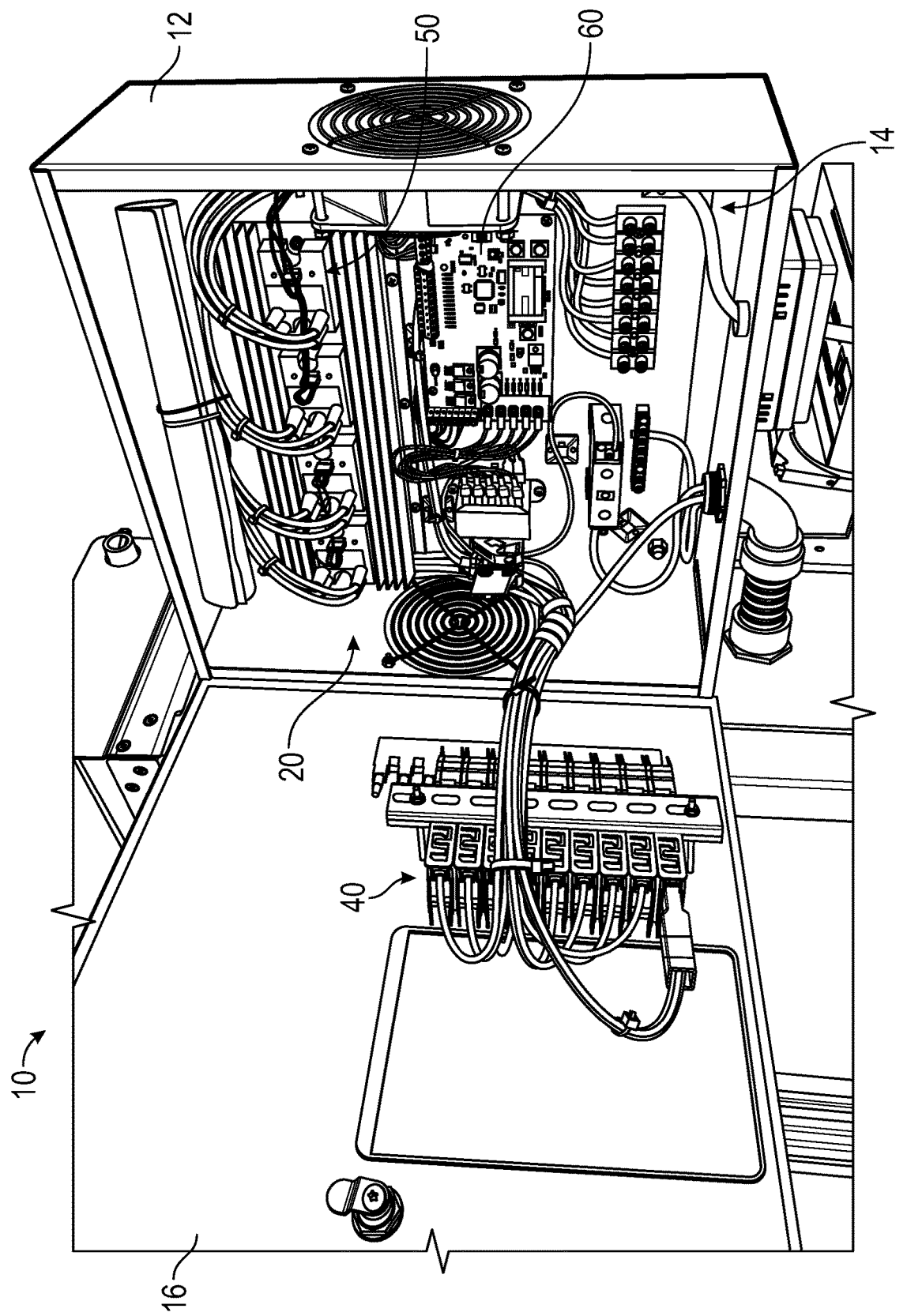
FIG. 1 is a perspective view of a control panel with integral overcurrent protection devices, according to an exemplary embodiment.

One embodiment relates to an anti-condensing system. The anti-condensing system includes one or more temperature regulating display units and a control panel configured to electrically couple between a power source and the one or more temperature regulating display units. Each of the one or more temperature regulating display units includes a housing, at least one thermal element, and at least one door selectively repositionable to facilitate accessing an interior of the housing. The control panel includes a panel housing defining an interior cavity, a panel door selectively repositionable to facilitate accessing the interior cavity of the panel housing, and a circuitry assembly disposed within the interior cavity. The circuitry assembly includes one or more relays, one or more overcurrent protection breakers, and a control circuit coupled to the one or more relays. Each of the one or more relays is coupled to a respective one of the at least one thermal element of the one or more temperature regulating display units. Each of the one or more overcurrent protection devices coupled to a respective one of the one or more relays and directly integrated into the control panel such that each of the one or more overcurrent protection devices can be individually locked out at the control panel. The control circuit is configured to actively control the one or more relays to prevent condensation from forming on the temperature regulating display units.

Another embodiment relates to an anti-condensing system. The anti-condensing system includes a control panel configured to electrically couple between a power source and a temperature regulating display unit. The control panel includes a housing defining an interior cavity, a door selectively repositionable to facilitate accessing the interior cavity of the housing, and a circuitry assembly disposed within the interior cavity. The circuitry assembly includes a relay configured to couple to a heating element of the temperature regulating display unit, an overcurrent protection breaker coupled to the relay and directly integrated into the control panel such that the overcurrent protection device can be locked out at the control panel, and a control circuit coupled to the relay. The control circuit is configured to actively control the relay to prevent condensation from forming on the temperature regulating display unit.

Still another embodiment relates to a method for preventing condensation from forming on a temperature regulating display unit. The method includes coupling a control panel between a power source and the temperature regulating display unit. The control panel includes (i) a relay configured to couple to a heating element of the temperature regulating display unit, (ii) an overcurrent protection breaker coupled to the relay and directly integrated into the control panel such that the overcurrent protection device can be locked out at the control panel, and (iii) a control circuit coupled to the relay. The method further includes receiving, by the control circuit, at least one of temperature data or humidity data indicative of a dew point proximate the temperature regulating display unit; and actively controlling, by the control circuit, a current provided by the relay to the heating element to maintain a temperature of components of the temperature regulating display unit above the dew point to prevent the formation of condensation thereon. The relay is configured to facilitate providing a pulsed current to the heating element to reduce an overall power consumption of the temperature regulating display unit.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

According to an exemplary embodiment, an anti-condensing system (e.g., an anti-sweat system, etc.) includes a control panel coupled to a main power source and one or more temperature regulating display units (e.g., coolers, freezers, refrigerators, temperature regulating display cases, etc.). The control panel includes a housing that defines a cavity that receives a circuitry assembly of the control panel. The circuitry assembly may include a panel disconnect, one or more overcurrent protection devices, one or more relay devices, and/or a control circuit. The control panel may be configured to control thermal elements (e.g., heating elements, etc.) of the temperature regulating display units (e.g., based on temperature and humidity data, etc.) to reduce and/or prevent moisture or condensation from building up (e.g., sweat buildup, etc.) on a transparent and/or translucent door or cover (e.g., an illuminating glass door, etc.) and/or frame of the temperature regulating display units. Typically, anti-condensing systems include overcurrent protection devices positioned externally from a control panel thereof. Such anti-condensing system disadvantageously make installation and maintenance difficult by requiring excessive wiring to connect the control panel to the externally positioned overcurrent protection devices, as well as require increased installation time relative to the control panel of the anti-condensing system of the present disclosure having internally positioned overcurrent protection devices (e.g., integral overcurrent protection devices, etc.).

Figure 2:
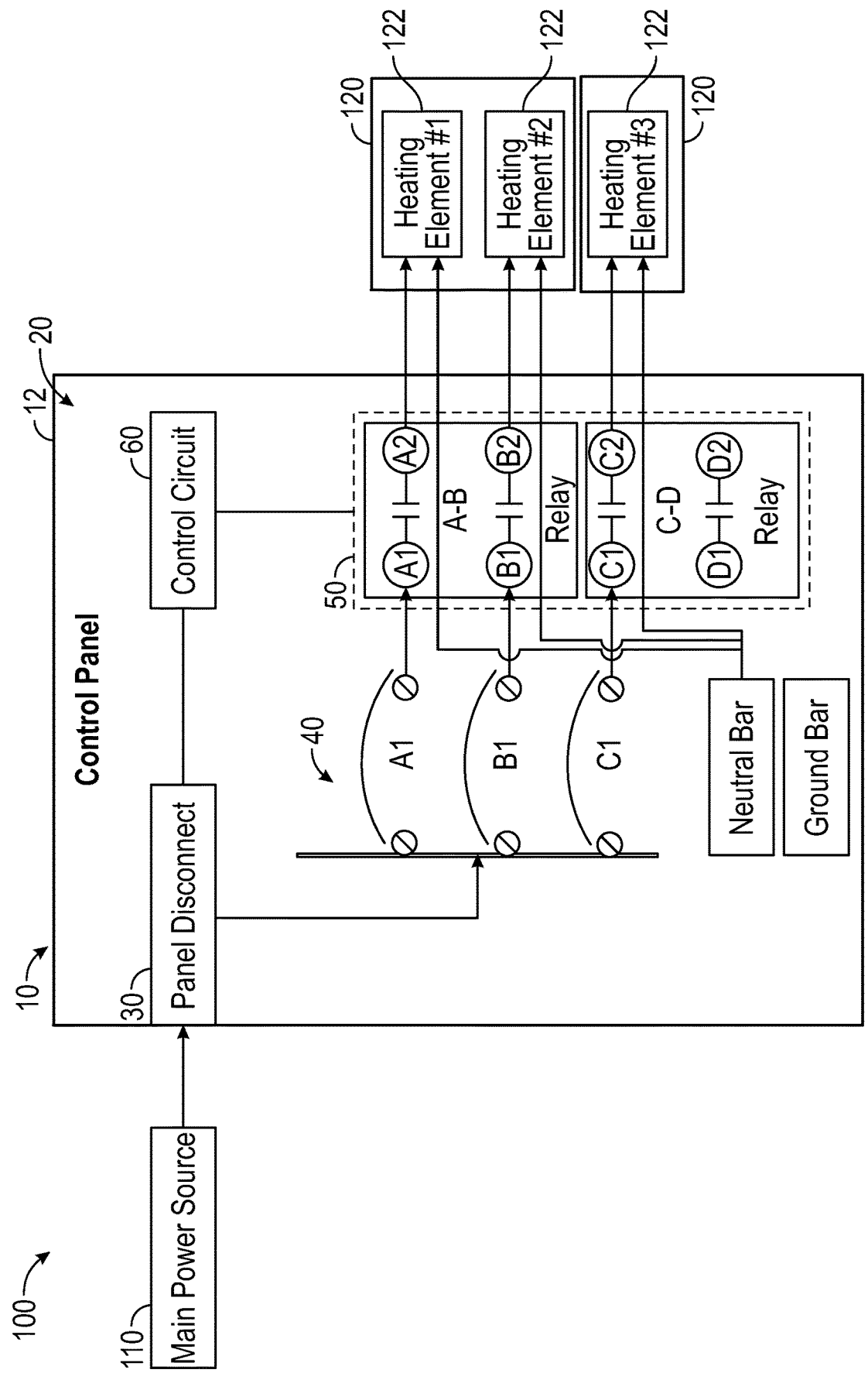
FIG. 2 is a schematic diagram of an anti-condensing control system including the control panel of FIG. 1, according to an exemplary embodiment.

According to the exemplary embodiment shown in FIGS. 1 and 2, a control panel, shown as anti-condensing control panel 10, is incorporated into a system, shown as anti-condensing system 100. As shown in FIGS. 1 and 2, the anti-condensing control panel 10 includes an enclosure, shown as panel housing 12. As shown in FIG. 1, the panel housing 12 defines a cavity, shown as circuitry cavity 14. The circuitry cavity 14 is selectively accessible via door, shown as control panel door 16, pivotally coupled to the panel housing 12. As shown in FIGS. 1 and 2, the circuitry cavity 14 of the panel housing 12 is configured to receive circuitry, shown as circuitry assembly 20.

The panel housing 12 and the control panel door 16 may be configured to enclose the circuitry assembly 20 within the anti-condensing control panel 10 and facilitate electrical connections. For example, the panel housing 12 may have one or more overall dimensions to provide sufficient spacing between components of the circuitry assembly 20. The panel housing 12 may include one or more cut-outs or raceways for wiring between circuitry assembly 20 and external devices (e.g., temperature regulating display devices, a main power supply, etc.). In some embodiments, at least one of the panel housing 12 and the control panel door 16 are configured for mounting one or more components of the circuitry assembly 20 within the anti-condensing control panel 10.

Figure 3:
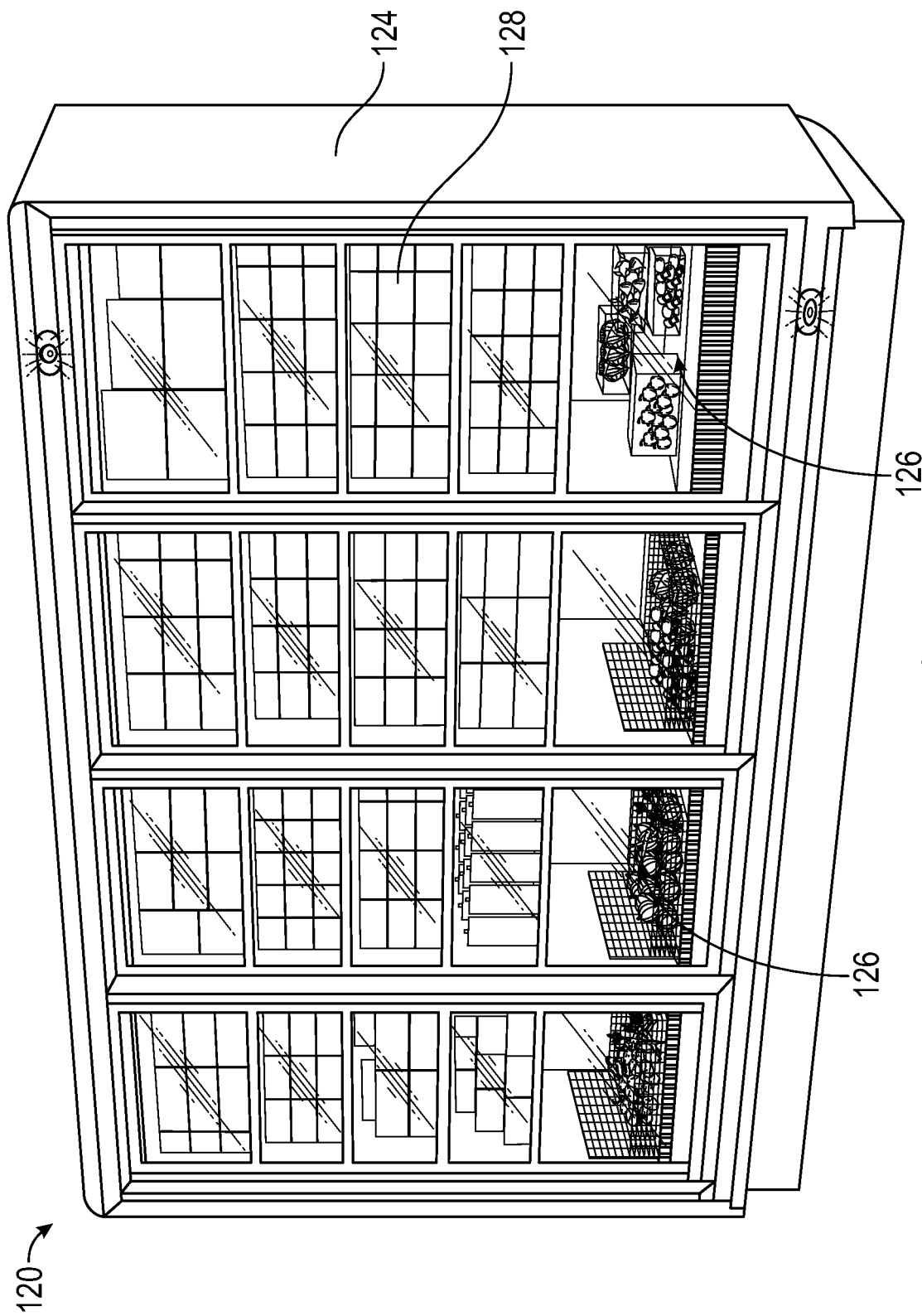
FIG. 3 is a perspective view of a temperature regulating display unit, according to an exemplary embodiment.

As shown in FIG. 2, the anti-condensing system 100 includes the anti-condensing control panel 10 electrically coupled to a power source, shown as main power source 110, and a plurality of temperature regulating display units or cases, shown as display units 120. The display units 120 may include one or more thermal elements, shown as heating elements 122. According to the exemplary embodiment shown in FIG. 3, the display units 120 are configured as a cooler display unit, a refrigerator display unit, a freezer display unit, or the like having a housing, shown as frame 124, with one or more transparent and/or translucent doors or covers (e.g., pivoting glass doors, sliding glass doors, illuminating glass doors, etc.), shown as doors 126, having clear or at least partially transparent panels (e.g., glass, Plexiglas, etc.), shown as panels 128. According to an exemplary embodiment, the doors 126 are selectively repositionable (e.g., slidable, pivotable, openable, etc.) relative to the frame 124 to facilitate accessing an interior of a respective display unit 120. As shown in FIG. 2, the anti-condensing control panel 10 is configured to receive power from the main power source 110 to power the circuitry assembly 20 to facilitate controlling the heating elements 122 of the display units 120.

As shown in FIG. 2, the anti-condensing control panel 10 is coupled to two display units 120 having a combined total of three heating elements 122. In other embodiments, the anti-condensing control panel 10 is coupled to one display unit 120 having one or more heating elements 122 (e.g., one, two, three, four, six, eight, twelve, etc.). In still other embodiments, the anti-condensing control panel 10 is coupled to three or more display units 120 (e.g., three, four, five, six, seven, eight, ten, twelve, sixteen, etc.) having a combined total of three or more heating elements 122.

According to an exemplary embodiment, the anti-condensing control panel 10 is configured to control the heating elements 122 of respective display units 120 to reduce and/or prevent moisture or condensation formation on the door(s) 126, the panel(s) 128, and/or the frame(s) 124 thereof. According to various embodiments, the anti-condensing control panel 10 is configured to receive different types of power supplies. By way of example, the type of power supply the anti-condensing control panel 10 receives may be based on the size of the anti-condensing control panel 10 and/or the number of heating elements 122 coupled thereto. In one embodiment, the anti-condensing control panel 10 is configured to receive a single phase 120 VAC power supply. In another embodiment, the anti-condensing control panel 10 is configured to receive a single phase 120/240 VAC power supply. In still another embodiment, the anti-condensing control panel 10 is configured to receive a three phase 120/208 VAC power supply. In other embodiments, the anti-condensing control panel 10 is configured to receive still another type of power supply.

As shown in FIGS. 1 and 2, the circuitry assembly 20 includes a disconnect device (e.g., a five amp breaker, an internal locking disconnect, a main lug, etc.), shown as panel disconnect 30; a plurality of overcurrent protection devices (e.g., circuit breakers, etc.), shown as overcurrent protection breakers 40; a plurality of relay devices, shown as relays 50; and a control circuit, shown as control circuit 60. In some embodiments, the circuitry assembly 20 includes additional, fewer, or different circuitry components. As shown in FIG. 1, (i) the overcurrent protection breakers 40 are mounted to the inner surface of the control panel door 16 and (ii) the relays 50 and the control circuit 60 are coupled to the panel housing 12, within the circuitry cavity 14. In other embodiments, the overcurrent protection breakers 40, the relays 50, and/or the control circuit 60 are otherwise positioned on and/or within the anti-condensing control panel 10.

As shown in FIG. 2, the panel disconnect 30 is positioned between the main power source 110 and the other components of the circuitry assembly 20 (e.g., the overcurrent protection breakers 40, the relays 50, the control circuit 60, etc.). According to an exemplary embodiment, the panel disconnect 30 is configured to facilitate electrically disconnecting or isolating the other components of the circuitry assembly 20 from an incoming power supply provided by the main power source 110. Providing the panel disconnect 30 within the anti-condensing control panel 10 may thereby facilitate disconnecting the anti-condensing control panel 10 from the main power source 110 without having to go to a remotely positioned main breaker panel for the building in which the anti-condensing system 100 is implemented. In other embodiments, the anti-condensing control panel 10 does not include the panel disconnect 30.

As shown in FIG. 2, the overcurrent protection breakers 40 are electrically connected to and receive power from the panel disconnect 30 within the panel housing 12. According to the exemplary embodiment shown in FIG. 2, the circuitry assembly 20 includes three overcurrent protection breakers 40. In other embodiments, the circuitry assembly 20 includes fewer or more overcurrent protection breakers 40 (e.g., one, two, four, six, eight, sixteen, etc.). The quantity of overcurrent protection breakers 40 may be dependent upon the intended application in which the anti-condensing control panel 10 is to be implemented with. The number of overcurrent protection breakers 40 may correspond with the number of relays 50 of the anti-condensing control panel 10 and/or the number of heating elements 122 intended to be included within the anti-condensing system 100. According to an exemplary embodiment, the overcurrent protection breakers 40 have a Underwriters Laboratories ("UL") 489 rating.

Each of the overcurrent protection breakers 40 is generally configured to directly energize a respective relay 50 to facilitate providing control signals to the associated heating element 122 of the respective relay 50. The overcurrent protection breakers 40 may be any suitable type of breaker or protective device responsive to an overcurrent condition.

In some embodiments, each of the overcurrent protection breakers 40 is rated at 20 amps and 120 volts. In other embodiments, each of the overcurrent protection breakers 40 is rated for a different amperage and/or voltage.

According to an exemplary embodiment, positioning the overcurrent protection breakers 40 directly within the panel housing 12 provides various advantages relative to prior systems having overcurrent protection devices remotely positioned from the anti-condensing control panel 10. By way of example, such an integrated configuration may effectively reduce the amount of wiring (e.g., up to 50%, etc.) required to setup the anti-condensing control panel 10 relative to a system that has overcurrent protection devices positioned externally from the control panel thereof. By way of another example, the integrated overcurrent protection breakers 40 reduce maintenance time by giving a technician local control over of each of the overcurrent protection breakers 40 and the other components of the circuitry assembly 20 (e.g., the relays 50, the control circuit 60, the panel disconnect 30, etc.) within a single anti-condensing control panel 10. By way of yet another example, each of the overcurrent protection breakers 40 may be individually locked out at the anti-condensing control panel 10. While in prior systems, overcurrent protection breakers may have been positioned anywhere from five feet to five hundred feet away from an associated control panel (e.g., depending on a store/building layout, etc.), as well as take up more of a footprint within the building by having two separate units with wiring extending therebetween.

As shown in FIG. 2, each of the relays 50 is electrically connected to an associated overcurrent protection breaker 40 and heating element 122. According to an exemplary embodiment, the relays 50 are configured to facilitate providing a pulsed current to the heating elements 122 to prevent sweat, moisture, condensation, etc. from building up or forming on the doors 126 of the display units 120. In one embodiment, the relays 50 are configured as solid state relays. In other embodiments, the relays 50 are configured as another suitable type of device. As shown in FIG. 2, the circuitry assembly 20 includes four relays 50 (e.g., relay A, relay B, relay C, and relay D). In other embodiments, the circuitry assembly 20 includes a different number of relays 50. By way of example, the circuitry assembly 20 may include anywhere from one relay 50 to twenty-four or more relays 50 (e.g., one, two, four, six, eight, sixteen, twenty-four, etc. relays 50) depending on the intended application.

According to an exemplary embodiment, the control circuit 60 is configured to actively control the relays 50 (e.g., individually, etc.) to prevent sweat, moisture, condensation, etc. from building up or forming on the doors 126 of the display units 120. The control circuit 60 may be configured to receive temperature data and/or humidity data indicative of a dew point outside of the display units 120 from respective sensors within a space (e.g., the building in which the anti-condensing system 100 is located, etc.), proximate one or more of the display units 120, on one or more of the display units, and/or still otherwise positioned. Based on such received data, the control circuit 60 may be configured to vary the pulsed current provided by the relays 50 to the heating elements 122. By way of example, the control circuit 60 may vary the pulsed current provided by a respective relay 50 to a respective heating element 122 to maintain the transparent and/or translucent material of the door 126 (and the frame thereof) the respective heating element 122 is associated with at a temperature above the dew point. By maintaining the temperature of the transparent and/or translucent material of the door 126 (e.g., the panels 128, etc.) above the dew point, condensation may be prevented.

According to an exemplary embodiment, operating the relays 50 in "pulse mode" (as described above) provides significant advantages over traditional anti-sweat heating systems. Traditionally, anti-sweat systems run continuously at full load, irrespective of the dew point, which consumes excessive amounts of energy, especially because the dew point often fluctuates greatly based on the time of the day and year (as temperature and humidity levels change). By providing the pulsed mode of operation, the control circuit 60 may effectively reduce power consumption dramatically such that a minimum required amount of power is consumed to maintain the doors 126 (e.g., glass window and metal frame, etc.) of the display units 120 a temperature above the dew point.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

The invention claimed is:

1. An anti-condensing system comprising:
    one or more temperature regulating display units, each of the one or more temperature regulating display units including a housing, at least one thermal element, and at least one door selectively repositionable to facilitate accessing an interior of the housing; and
    a control panel configured to electrically couple between a power source and the one or more temperature regulating display units, the control panel including:
    a panel housing defining an interior cavity;
    a panel door selectively repositionable to facilitate accessing the interior cavity of the panel housing; and
    a circuitry assembly disposed within the interior cavity, the circuitry assembly including:
        one or more relays, each of the one or more relays coupled to a respective one of the at least one thermal element of the one or more temperature regulating display units;
        one or more overcurrent protection breakers, each of the one or more overcurrent protection breakers coupled to a respective one of the one or more relays and directly integrated into the control panel such that each of the one or more overcurrent protection breakers can be individually locked out at the control panel; and
        a control circuit coupled to the one or more relays, the control circuit configured to actively control the one or more relays to prevent condensation from forming on the temperature regulating display units.

2. The anti-condensing system of claim 1, wherein the one or more overcurrent protection breakers are positioned between the power source and the one or more relays.

3. The anti-condensing system of claim 2, wherein the control panel includes a panel disconnect positioned within the interior cavity of the panel housing and between the power source and the circuitry assembly, the panel disconnect configured to facilitate electrically isolating the circuitry assembly from an incoming power supply provided by the power source.

4. The anti-condensing system of claim 1, wherein the one or more overcurrent protection breakers are coupled to a rear surface of the panel door.

5. The anti-condensing system of claim 1, wherein the one or more relays are coupled to the panel housing.

6. The anti-condensing system of claim 1, wherein the one or more relays are configured to facilitate providing a pulsed current to the at least one thermal element of each of the one or more temperature regulating display units.

7. The anti-condensing system of claim 6, wherein the pulsed current reduces an overall power consumption of the one or more temperature regulating display units.

8. The anti-condensing system of claim 6, wherein the control circuit is configured to receive at least one of temperature data or humidity data indicative of a dew point proximate the one or more temperature regulating display units.

9. The anti-condensing system of claim 8, wherein the control circuit is configured to vary the pulsed current provided by the one or more relays to maintain a temperature of at least one of the housing or the at least one door of each of the one or more temperature regulating display units above the dew point to prevent the formation of condensation thereon.

10. The anti-condensing system of claim 1, wherein the anti-condensing system includes a plurality of temperature regulating display units, a plurality of relays, and a plurality of overcurrent protection breakers.

11. An anti-condensing system comprising:
a control panel configured to electrically couple between a power source and a temperature regulating display unit, the control panel including:
a housing defining an interior cavity;
a door selectively repositionable to facilitate accessing the interior cavity of the housing; and
a circuitry assembly disposed within the interior cavity, the circuitry assembly including:
a relay configured to couple to a heating element of the temperature regulating display unit;
an overcurrent protection breaker coupled to the relay and directly integrated into the control panel such that the overcurrent protection device can be locked out at the control panel; and
a control circuit coupled to the relay, the control circuit configured to actively control the relay to prevent condensation from forming on the temperature regulating display unit.

12. The anti-condensing system of claim 11, wherein circuitry assembly includes a plurality of relays and a plurality of overcurrent protection breakers, each of the plurality of overcurrent protection breakers associated with a respective one of the plurality of relays and each of the plurality of relays associated with a respective heating element.

13. The anti-condensing system of claim 11, wherein the overcurrent protection breaker is positioned between the power source and the relay.

14. The anti-condensing system of claim 13, wherein the control panel includes a panel disconnect positioned within the interior cavity of the housing and between the power source and the circuitry assembly, the panel disconnect configured to facilitate electrically isolating the circuitry assembly from an incoming power supply provided by the power source.

15. The anti-condensing system of claim 11, wherein the overcurrent protection breaker is coupled to a rear surface of the door.

16. The anti-condensing system of claim 11, wherein the relay is coupled to the housing.

17. The anti-condensing system of claim 11, wherein relay is configured to facilitate providing a pulsed current to the heating element.

18. The anti-condensing system of claim 11, wherein the control circuit is configured to receive at least one of temperature data or humidity data indicative of a dew point proximate the temperature regulating display unit.

19. The anti-condensing system of claim 18, wherein the control circuit is configured to vary a current provided by the relay to the heating element to maintain a temperature of components of the temperature regulating display unit above the dew point to prevent the formation of condensation thereon.

20. A method for preventing condensation from forming on a temperature regulating display unit, the method comprising:
coupling a control panel between a power source and the temperature regulating display unit, the control panel including (i) a relay configured to couple to a heating element of the temperature regulating display unit, (ii) an overcurrent protection breaker coupled to the relay and directly integrated into the control panel such that the overcurrent protection device can be locked out at the control panel, and (iii) a control circuit coupled to the relay;
receiving, by the control circuit, at least one of temperature data or humidity data indicative of a dew point proximate the temperature regulating display unit; and
actively controlling, by the control circuit, a current provided by the relay to the heating element to maintain a temperature of components of the temperature regulating display unit above the dew point to prevent the formation of condensation thereon;
wherein the relay is configured to facilitate providing a pulsed current to the heating element to reduce an overall power consumption of the temperature regulating display unit.

* * * * *